(12) United States Patent
Li et al.

(10) Patent No.: US 9,147,614 B2
(45) Date of Patent: Sep. 29, 2015

(54) TRANSISTOR DEVICE AND FABRICATION METHOD

(71) Applicant: Semiconductor Manufacturing International Corp., Shanghai (CN)

(72) Inventors: Aileen Li, Shanghai (CN); Jinghua Ni, Shanghai (CN)

(73) Assignee: SEMICONDUCTOR MANUFACTURING INTERNATIONAL CORP., Shanghai (CN)

( * ) Notice: Subject to any disclaimer, the term of this patent is extended or adjusted under 35 U.S.C. 154(b) by 217 days.

(21) Appl. No.: 13/904,341

(22) Filed: May 29, 2013

(65) Prior Publication Data

US 2014/0077313 A1    Mar. 20, 2014

(30) Foreign Application Priority Data

Sep. 18, 2012   (CN) .......................... 2012 1 0348153

(51) Int. Cl.

| | |
|---|---|
| *H01L 21/02* | (2006.01) |
| *H01L 21/8238* | (2006.01) |
| *H01L 29/78* | (2006.01) |
| *H01L 21/28* | (2006.01) |
| *H01L 29/66* | (2006.01) |
| *H01L 29/51* | (2006.01) |

(52) U.S. Cl.
CPC ...... *H01L 21/8238* (2013.01); *H01L 21/28185* (2013.01); *H01L 21/28194* (2013.01); *H01L 21/823842* (2013.01); *H01L 29/517* (2013.01); *H01L 29/66545* (2013.01); *H01L 29/78* (2013.01); *H01L 29/513* (2013.01)

(58) Field of Classification Search
CPC ..................... H01L 29/517; H01L 21/823842; H01L 21/28194; H01L 21/324
See application file for complete search history.

(56) References Cited

U.S. PATENT DOCUMENTS

| | | | |
|---|---|---|---|
| 2012/0080756 A1* | 4/2012 | Suzuki et al. | 257/369 |
| 2012/0261758 A1* | 10/2012 | Lee et al. | 257/368 |
| 2013/0062704 A1* | 3/2013 | Cheng et al. | 257/369 |

* cited by examiner

*Primary Examiner* — Zandra Smith
*Assistant Examiner* — John M Parker
(74) *Attorney, Agent, or Firm* — Anova Law Group, PLLC

(57) ABSTRACT

Various embodiments provide transistors and their fabrication methods. An exemplary method for forming a transistor includes removing a dummy gate to form a trench over a semiconductor substrate. A high-k dielectric layer can be conformally formed on surface of the trench and then be fluorinated to form a fluorinated high-k dielectric layer. A functional layer can be formed on the fluorinated high-k dielectric layer and a metal layer can be formed on the functional layer to fill the trench with the metal layer. Due to fluorination of the high-k dielectric layer, negative bias temperature instability of the formed transistor can be reduced and oxygen vacancies can be passivated to reduce positive bias temperature instability of the transistor.

20 Claims, 10 Drawing Sheets

TRANSISTOR DEVICE AND FABRICATION METHOD

CROSS-REFERENCES TO RELATED APPLICATIONS

This application claims priority to Chinese Patent Application No. CN201210348153.6, filed on Sep. 18, 2012, the entire contents of which are incorporated herein by reference.

FIELD OF THE DISCLOSURE

The present disclosure relates to the field of semiconductor technology and, more particularly, relates to metal gate structures, MOS transistors, and CMOS transistors and their fabrication methods.

BACKGROUND

With the continuous development of semiconductor technologies, feature size of metal-oxide-semiconductor (MOS) transistors has been reduced. Accordingly, the thickness of gate dielectric layers in the MOS transistors has become thinner and thinner. When a gate dielectric layer is overly thinned, however, various issues may occur. These issues may include time-related voltage breakdowns, hot carrier effects, and diffusion of impurities from the gate electrode toward the substrate. This can adversely affect stability and reliability of the formed transistors. Currently, use of $SiO_2$ as a gate dielectric material may reach its physical limitation. Replacing $SiO_2$ gate dielectric layer with high-k gate dielectric layer may significantly increase the physical thickness with the same effective oxide thickness (EOT) achieved to reduce leakage current of the gate electrode.

Most of high-k gate dielectric layers are made of metal oxides, which do not have fixed atomic coordinates. Compared with $SiO_2$ gate dielectric material, high-k gate dielectric materials have much poorer bonding stability with the silicon substrate. Consequently, interfacial defects are formed between the high-k gate dielectric layer and the silicon substrate. The interfacial defects may be combined with oxygen to produce interstitial oxygen atoms and positively charged oxygen vacancies, which may further be combined with hydrogen to form unstable hydrogen bonds. Such unstable hydrogen bonds can cause a PMOS transistor to have negative bias temperature instability (NBTI). That is, at high temperatures and when the gate electrode is negatively biased, electrical parameter drift of the PMOS transistor may occur. On the other hand, the interstitial oxygen atoms and positively charged oxygen vacancies can cause an NMOS transistor to have positive bias temperature instability (PBTI). That is, at high temperatures and when the gate electrode is positively biased, electrical parameter drift of the NMOS transistor may occur.

Thus, there is a need to provide transistors with reduced NBTI and PBTI and methods for fabricating the transistors.

BRIEF SUMMARY OF THE DISCLOSURE

According to various embodiments, there is provided a method for forming a transistor. In this method, a dummy gate and an interlayer dielectric layer can be formed over a semiconductor substrate. A top surface of the dummy gate can be flush with a top surface of the interlayer dielectric layer. The dummy gate can then be removed to form a trench over the semiconductor substrate. A high-k dielectric layer can be conformally formed over each surface of the trench and the interlayer dielectric layer. The high-k dielectric layer can be fluorinated to form a fluorinated high-k dielectric layer. A functional layer can be formed on the fluorinated high-k dielectric layer and a metal layer can be formed on the functional layer to fill the trench with the metal layer. The interlayer dielectric layer can be exposed by polishing the metal layer, the functional layer, and the fluorinated high-k dielectric layer on the interlayer dielectric layer.

According to various embodiments, there is also provided a method for forming a CMOS transistor. A semiconductor substrate can be provided to include a first region and a second region. The first region can include a first dummy gate formed on the semiconductor substrate. The second region can include a second dummy gate formed on the semiconductor substrate. An interlayer dielectric layer can be formed over the semiconductor substrate. The interlayer dielectric layer can have a top surface flushed with a top surface of each of the first and the second dummy gates. The first dummy gate can be removed to form a first trench, and the second dummy gate can be removed to form a second trench. A high-k dielectric layer can be conformally formed over each surface of the first trench, the second trench, and the interlayer dielectric layer. The high-k dielectric layer can be fluorinated to form a fluorinated high-k dielectric layer. A first functional layer can be formed on the fluorinated high-k dielectric layer in the first region and a second functional layer can be formed on the fluorinated high-k dielectric layer in the second region. The first functional layer and the second functional layer can have different work functions. A metal layer can be formed on the first and second functional layers to fill each of the first trench and the second trench. The interlayer dielectric layer can be exposed by a surface planarization process.

According to various embodiments, there is further provided a transistor. The transistor can include an interlayer dielectric layer disposed over a semiconductor substrate. The interlayer dielectric layer can include a trench disposed in the interlayer dielectric layer and over the semiconductor substrate. A fluorinated high-k dielectric layer can be disposed conformally over a surface of the trench. A functional layer can be disposed on the fluorinated high-k dielectric layer. A metal layer can be disposed on the functional layer to fill the trench in the functional layer to form a gate electrode.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

In accordance with various disclosed embodiments, to avoid interfacial defects generated at interfaces (e.g., between high-k gate dielectric layer and silicon substrate, and between high-k gate dielectric layer and metal gate electrode), high-k dielectric layers can be treated, e.g., fluorinated, during formation of a metal gate structure. For example, a trench can be formed by removing a dummy gate. A high-k gate dielectric layer can be conformally formed on the bottom and sidewall of the trench and can be fluorinated so that fluorine bonds (e.g., F—Si, F—Hf, etc.) can be formed between high-k gate dielectric layer and the semiconductor substrate.

Because the fluorine bonds have higher bond energy than hydrogen bonds generated between untreated high-k gate dielectric layer and the semiconductor substrate, NBTI of the subsequently-formed transistor can be reduced. In addition, because fluorine is a strong oxidant, it can prevent oxygen vacancies from producing donor levels in band gaps and prevent oxygen vacancies from being positively charged. As a result, the oxygen vacancies can be passivated and PBTI of the subsequently-formed transistor can be reduced.

Figure 19:
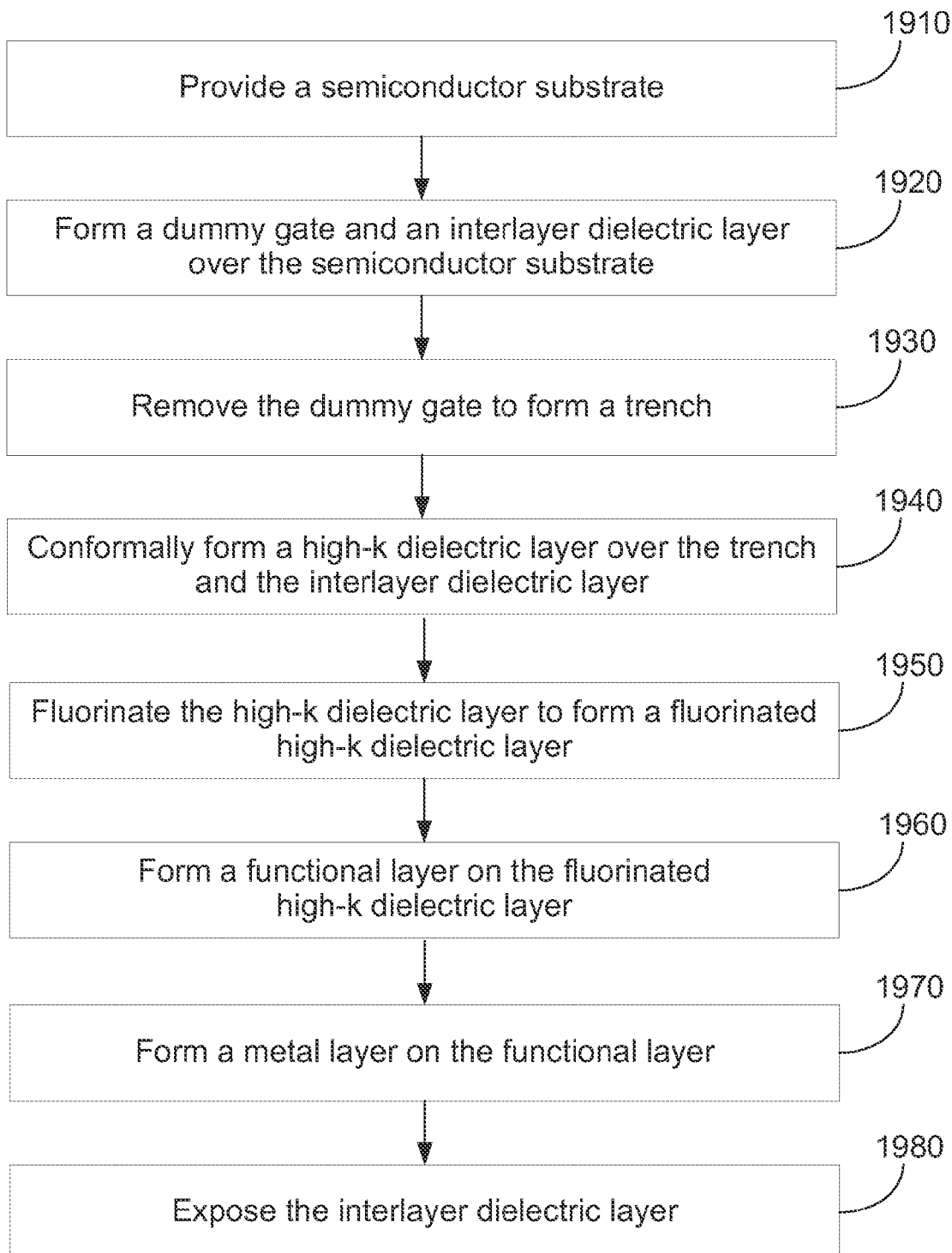
FIG. 19 depicts an exemplary method for forming an exemplary MOS transistor in accordance with various disclosed embodiments.

FIGS. 1-8 are schematics of cross-sectional views of an exemplary MOS transistor, while FIG. 19 depicts an exemplary method for forming an exemplary MOS transistor in accordance with various disclosed embodiments. Note that although FIGS. 1-8 depict structures corresponding to the method depicted in FIG. 19, the structures and the method are not limited to each other in any manner.

Figure 1:
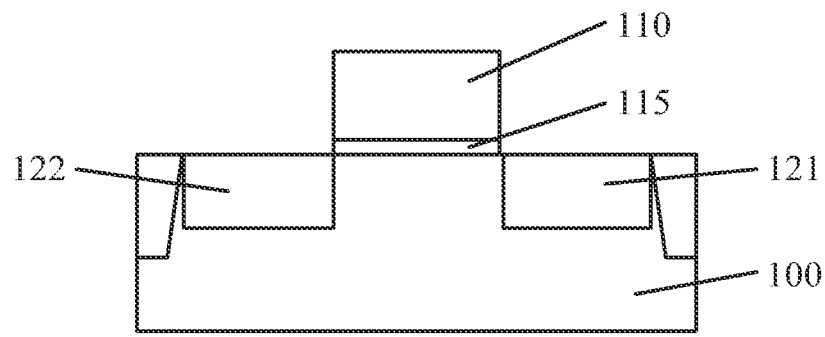
FIGS. 1-8 are schematics of cross-sectional views of an exemplary MOS transistor at various stages during its formation in accordance with various disclosed embodiments.

In Step 1910 of FIG. 19 and referring to FIG. 1, there is provided a semiconductor substrate 100. A second silicon oxide layer 115 can be formed on the semiconductor substrate 100. A source region 121 and a drain region 122 can be formed in the semiconductor substrate 100 on both sides of the dummy gate 110.

The semiconductor substrate 100 can be, e.g., silicon, germanium, silicon nitride, and/or silicon-on-insulator (SOI). Depending on specific semiconductor device to be formed thereon, certain substrate can be selected.

In Step 1920 of FIG. 19, a dummy gate 110 can be formed on the second silicon oxide layer 115. In one embodiment, the second silicon oxide layer 115 is formed between the dummy gate 110 and the semiconductor substrate 100 to prevent direct contact between the semiconductor substrate and the subsequently formed high-k gate dielectric layer, because such direct contact can produce defects due to lattice mismatch. In other embodiments, the second silicon oxide layer may not be formed between the dummy gate 110 and the semiconductor substrate 100.

Sidewall spacers (not shown) may be formed on sidewall of the dummy gate and can be used as a mask for ion implantations to form source and drain regions.

In some embodiments, ion implantations can be performed to form a source region 121 and a drain region 122 in the semiconductor substrate on both sides of dummy gate 110. In other embodiments, to improve carrier mobility in channel region of the MOS transistor, silicon-containing stress layers (e.g., silicon carbide or silicon-germanium) can be formed in/on the semiconductor substrate on both sides of the dummy gate. Carrier mobility can be improved by generating compressive stress or tensile stress in the channel region. Electrical performance of the MOS transistor can be improved.

Figure 2:
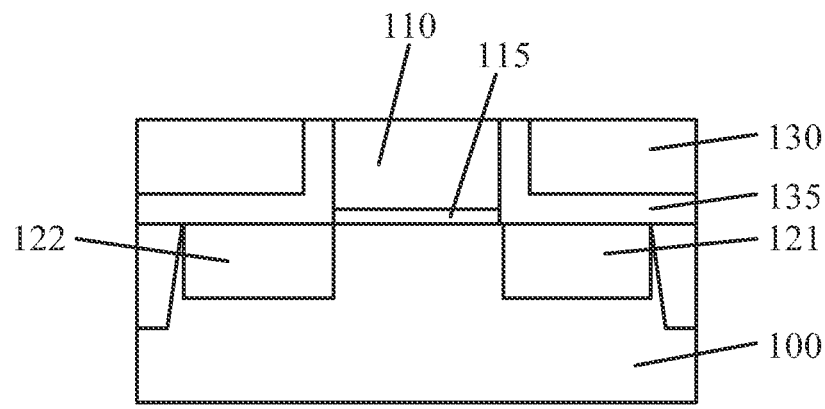

Still in Step 1920 of FIG. 19 and referring to FIG. 2, an etch stop layer 135 can be formed on the semiconductor substrate 100 and the dummy gate 110. An interlayer dielectric (ILD) layer 130 can be formed on the etch stop layer 135. The interlayer dielectric layer 130 can be polished or planarized, e.g., by a chemical mechanical planarization (CMP), until a top surface of the dummy gate 110 is exposed and is flush with the top surface of the polished interlayer dielectric layer 130.

The interlayer dielectric layer 130 can be made of a material including, e.g., silicon oxide, and/or low-k dielectric or ultra-low-k dielectric materials such as amorphous carbon, silicon-containing aerogels, etc. In one embodiment, the interlayer dielectric layer 130 is made of silicon oxide.

The etch stop layer 135 can be formed on the semiconductor substrate 100 and the dummy gate 110, before the interlayer dielectric layer 130 is formed. The etch stop layer 135 can be used as a barrier layer, when polishing the interlayer dielectric layer 130 to expose the dummy gate 110. The etch stop layer 135 can prevent the dummy gate 110 from being overly polished. Therefore, the height of the subsequently formed metal gate electrode can be controlled. In addition, by controlling the formation process, the etch stop layer 135 can exert tensile or compressive stress on the semiconductor substrate. This can also improve performance of the subsequently formed MOS transistor.

Figure 3:
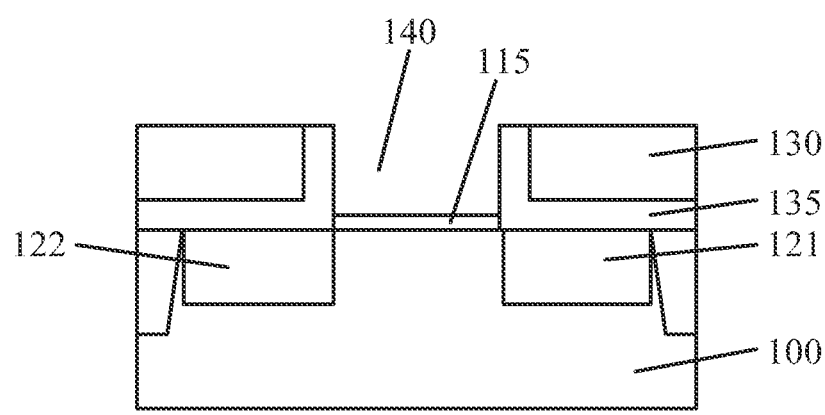

In Step 1930 of FIG. 19 and referring to FIG. 3, the dummy gate 110 can be removed to form a trench 140 on the second silicon oxide layer 115. In some embodiments, a wet etching process can be used to remove the dummy gate 110 to form the trench 140. Since the dummy gate 110 can be made of polysilicon and the interlayer dielectric layer 130 can be made of silicon oxide, the etching solution can include potassium hydroxide or tetramethyl ammonium hydroxide (TMAH) solution to remove polysilicon. In other embodiments, the dummy gate 110 can be removed by a plasma etching having a high etching selectivity over the materials used for the dummy gate 110 and the interlayer dielectric layer 130.

Figure 4:
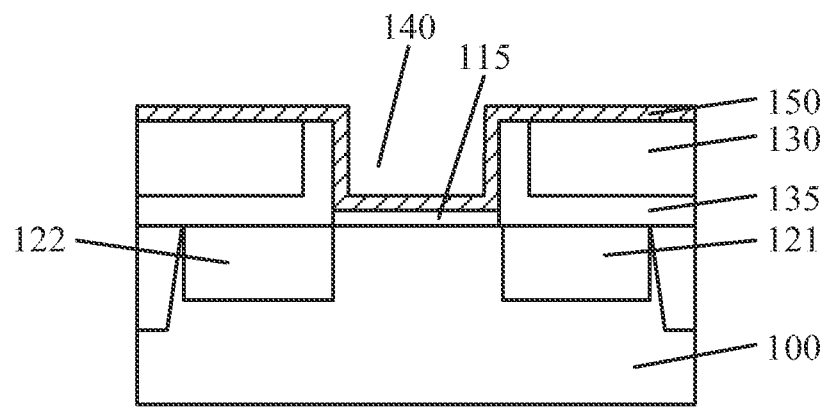

In Step 1940 of FIG. 19 and referring to FIG. 4, a high-k gate dielectric layer 150 can be conformally formed on the bottom and sidewall of the trench 140 and on the interlayer dielectric layer 130.

The high-k gate dielectric layer 150 can be made of a material including, e.g., $HfO_2$, $La_2O_3$, HfSiON, $HfAlO_2$, and/or any suitable materials. The high-k gate dielectric layer 150 can be formed by, e.g., chemical vapor deposition (CVD), atomic layer deposition (ALD), etc.

In some cases, the above-disclosed wet or dry etching process to remove the dummy gate 110 may damage surfaces of the bottom and sidewall of the trench 140, thereby generating rough surfaces or surface defects. Optionally, a first silicon oxide layer (not shown) can be formed on the bottom and sidewall of the trench 140, and on the interlayer dielectric layer 130. The high-k gate dielectric layer 150 can then be formed on the first silicon oxide layer.

In another embodiment, the second silicon oxide layer may not be included and the semiconductor substrate can be exposed at bottom of the trench. The high-k dielectric gate layer can be formed directly on sidewall surface of the trench and on the exposed surface of the semiconductor substrate at the bottom of the trench.

The high-k gate dielectric layers can be made of metal oxides containing transition metals. Chemical and electrical characteristics of a transition metal are generally determined by the outmost electronic states, i.e., the (n)d and (n+1)s valence electrons of the transition metal. Valence electrons of a transition metal may be easily transferred to empty orbit 3 s or 3 p of oxygen. Therefore, a transition metal can be oxidized to form a highly-coordinated bond of ionic metal-oxygen. Such metal-oxygen bond can have high ionic properties and low the conduction band (relative to silicon-oxygen bond). Thermal stability can be reduced. Oxygen vacancies can be produced.

During formation of a high-k gate dielectric layer, low temperatures have to be used to process the transition metal because high temperatures cause oxygen to quickly diffuse toward silicon surface to form a silicon oxide layer and to decrease dielectric constant of the semiconductor substrate. The low processing temperature, however, may result in incomplete oxidation and produce large amount of interstitial oxygen atoms and oxygen vacancies. Such oxygen vacancies can generate donor levels in band gaps and become positively charged.

When the gate electrode of an NMOS transistor is positively biased, the interstitial oxygen atoms and positively charged oxygen vacancies can capture or trap electrons from the high-k gate dielectric layer and the semiconductor substrate. Rapid charging/discharging may then occur. As a result, threshold voltage of the NMOS transistor may be shifted, and saturation drain current and the absolute value of transconductance may be changed. These property changes can reduce operation speed of the NMOS transistor; increase mismatches between adjacent transistors; and ultimately lead to circuit failure.

Hydrogen ion is a common impurity in semiconductor processing. In dry oxygen, a hydrogen concentration can be about $10^{19}$ $cm^{-3}$. In wet oxygen, a hydrogen concentration can be about $10^{20}$ $cm^{-3}$. During an oxidation process, hydrogen may be doped into the oxide layer. A large amount of hydrogen may be accumulated at oxide/silicon (e.g., $SiO_2$/Si or $HfO_2$/Si) interface to form H—Si and/or H—Hf bonds.

When the gate electrode of a PMOS transistor is negatively biased, the H—Si or H—Hf bonds can be easily broken to produce interfacial defects, thereby generating a rapid charging/discharging. As a result, absolute values of threshold voltage and drain current in the linear region of the PMOS transistor may be increased, and saturation drain current and the absolute value of transconductance may be decreased. These property changes can reduce operation speed of the PMOS transistor; increase mismatches between adjacent transistors; and ultimately lead to circuit failure.

Figure 5:
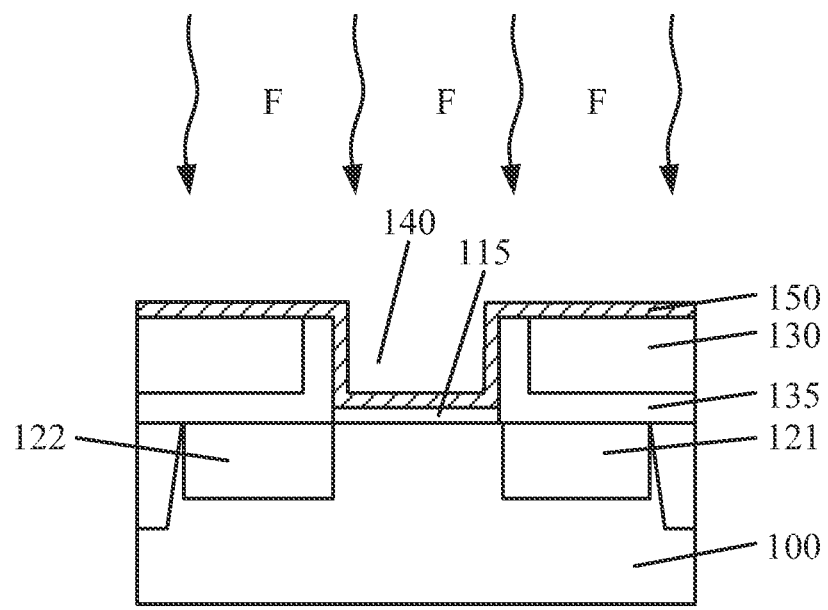

In Step 1950 of FIG. 19 and referring to FIG. 5, the high-k gate dielectric layer 150 can be treated by a fluorination process. The fluorination process can include one or more of an implantation of fluorine-containing ions, an annealing at a fluorine-containing atmosphere, and/or an annealing at a fluorine-containing plasma environment. The fluorine sources used in the fluorination process can include one or more of $F_2$, HF, NF3, $PF_5$, $PF_3$, $CF_4$, $CH_2F_2$, and/or $CHF_3$. The fluorination process can be performed directly on the high-k gate dielectric layer 150 and/or related layers/components, and fluorine can be doped into, e.g., one or more of the high-k gate dielectric layer 150, the first and/or the second silicon oxide layer under the high-k gate dielectric layer 150, and/or the surface of the channel region in the semiconductor substrate. Further, a shallow diffusion depth, a short processing time, and a low processing power can be used to sufficiently treat or fluorinate the high-k gate dielectric layer 150 and/or related layers/components with low processing cost.

The fluorination treatment can form fluorine bonds (e.g., F—Si bond, F—Hf bond, etc.) in the high-k gate dielectric layer 150, the first and/or the second silicon oxide layer under the high-k gate dielectric layer 150, and/or silicon surface of the channel region in the semiconductor substrate. Because fluorine has strong chemical energy, the fluorine bond has higher energy than hydrogen bonds. The amount of interfacial defects can be decreased. NBTI of the MOS transistor can be reduced. In addition, because fluorine is a strong oxidant, it can prevent oxygen vacancies from producing donor levels in band gaps and becoming positively charged. Therefore, oxygen vacancies can be passivated, the amount of interfacial defects can be reduced, and PBTI of the MOS transistor can be reduced.

In one embodiment, the fluorination process can include an ion implantation with fluorine-containing ions. Specifically, a fluorine-containing gas can be plasma ionized, and the fluorine-containing plasma can be implanted into the high-k gate dielectric layer 150 and/or related layers/components. The implantation energy can range from about 2 KeV to about 20 KeV and the implantation dosage can range from about $1 \times 10^{17}$ to about $1 \times 10^{20}$ atoms/$m^3$.

In another embodiment, the fluorination process can be an annealing process at a fluorine-containing atmosphere. Specifically, the annealing process can be conducted in a reaction chamber that has a pressure ranging from about 0.5 Torr to about 5 Torr, and a temperature ranging from about 300° C. to about 800° C. The annealing time can range from about 5 seconds to about 60 seconds.

In another embodiment, the fluorination process can be an annealing process at a fluorine-containing plasma environment. Specifically, a fluorine-containing gas can be plasma ionized in a reaction chamber and the formed fluorine-containing plasma can be produced. The annealing process can be conducted in the reaction chamber that has a pressure ranging from about 0.5 Torr to about 5 Torr, and a temperature ranging from about 300° C. to about 800° C. The annealing time can range from about 5 seconds to about 60 seconds.

Since the high-k gate dielectric layer 150 and/or related layers/components are not physically bombarded during the annealing processes under fluorine-containing atmosphere or fluorine-containing plasma environment, the high-k gate dielectric layer 150 and/or related layers/components can be formed with high quality. In addition, plasma ionization of fluorine-containing gas is an exothermic process. The heat generated from such exothermic process can be used to anneal the high-k gate dielectric layer 150 and/or related layers/components, thereby saving energy.

Figure 6:
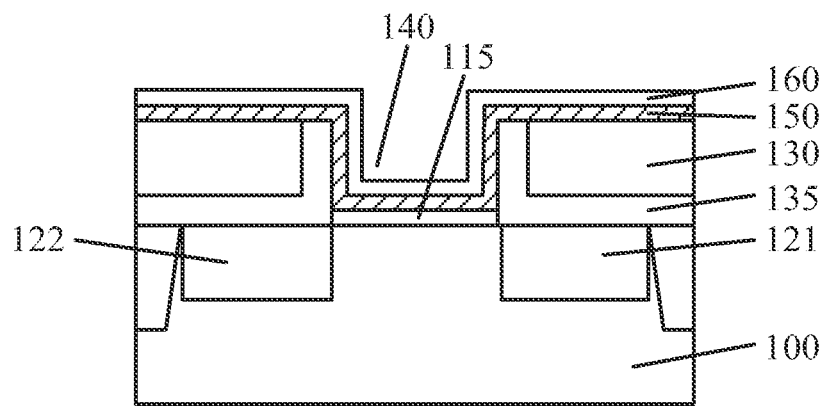

In Step 1960 of FIG. 19 and referring to FIG. 6, a functional layer 160 can be formed on the high-k gate dielectric layer 150. In one embodiment, before the functional layer 160 is formed, a diffusion barrier layer (not shown) may be optionally formed on high-k gate dielectric layer 150. Such diffusion barrier layer can prevent a subsequently formed metal layer from being diffused into the interlayer dielectric layer and/or the high-k gate dielectric layer. The metal diffusion can lead to short circuits between adjacent interconnect layers and between adjacent devices, and lead to increased amount of defects in the high-k gate dielectric layer. The diffusion barrier layer can be made of a material including, e.g., TiN or TaN. In other embodiments, a diffusion barrier layer may not be formed, while the functional layer may be used as a diffusion barrier layer. In this case, the number of processing steps can be reduced and the metal diffusion can be avoided.

The functional layer 160 can be made of a material including, Ti, Ta, TiN, TaN, TiAl, TaC, TaSiN, and/or TiAlN. The functional layer 160 can be formed by, e.g., physical vapor deposition or atomic layer deposition (ALD). By controlling thickness and type of materials used for the functional layer and materials used for a subsequently formed metal gate, the work function of the metal gate can be controlled.

Figure 7:
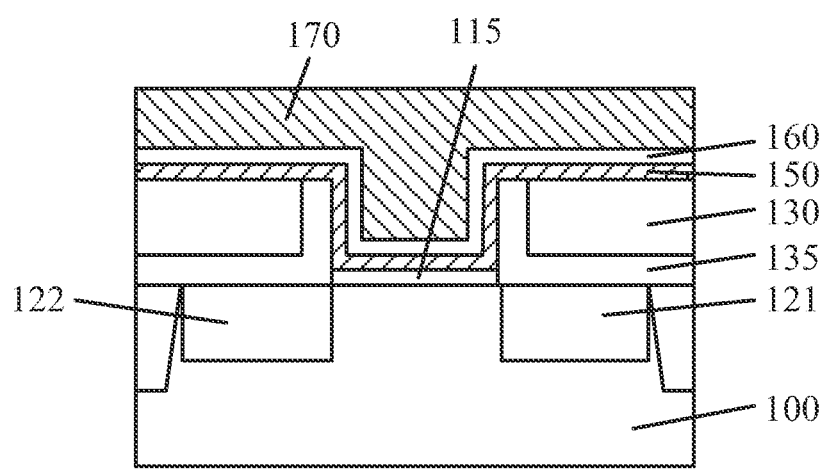

In Step 1970 of FIG. 19 and referring to FIG. 7, a metal layer 170 can be formed on the functional layer 160. The trench 140 in the fluorinated high-k gate dielectric layer 150 can be filled by the metal layer 170. The metal layer 170 can be made of a material including one or more of Al, Cu, Ti, Ag, Au, Pt, and Ni. The metal layer 170 can be formed by a process including, e.g., sputtering, chemical vapor deposition, or electroplating.

Figure 8:
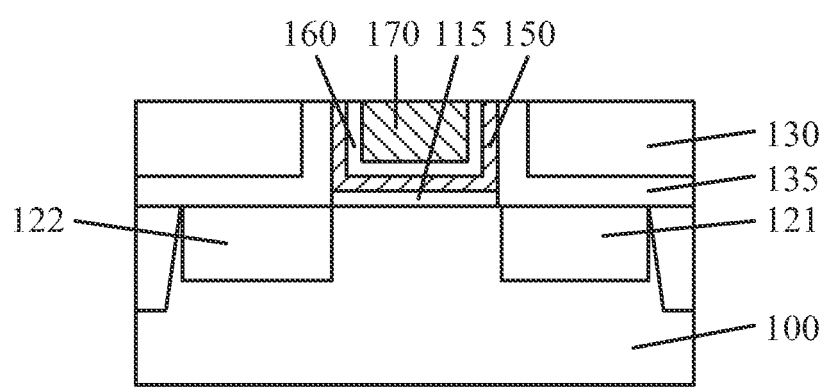

In Step 1980 of FIG. 19 and referring to FIG. 8, the metal layer 170 on each of the interlayer dielectric layer 130, the functional layer 160, and the fluorinated high-k gate dielectric layer 150 can be polished or planarized, e.g. by a chemical mechanical planarization. Each surface of the interlayer dielectric layer 130, and the metal layer 170, the functional layer 160, and fluorinated high-k gate dielectric layer 150 in the trench, can then be exposed to form a metal gate structure.

Figure 17:
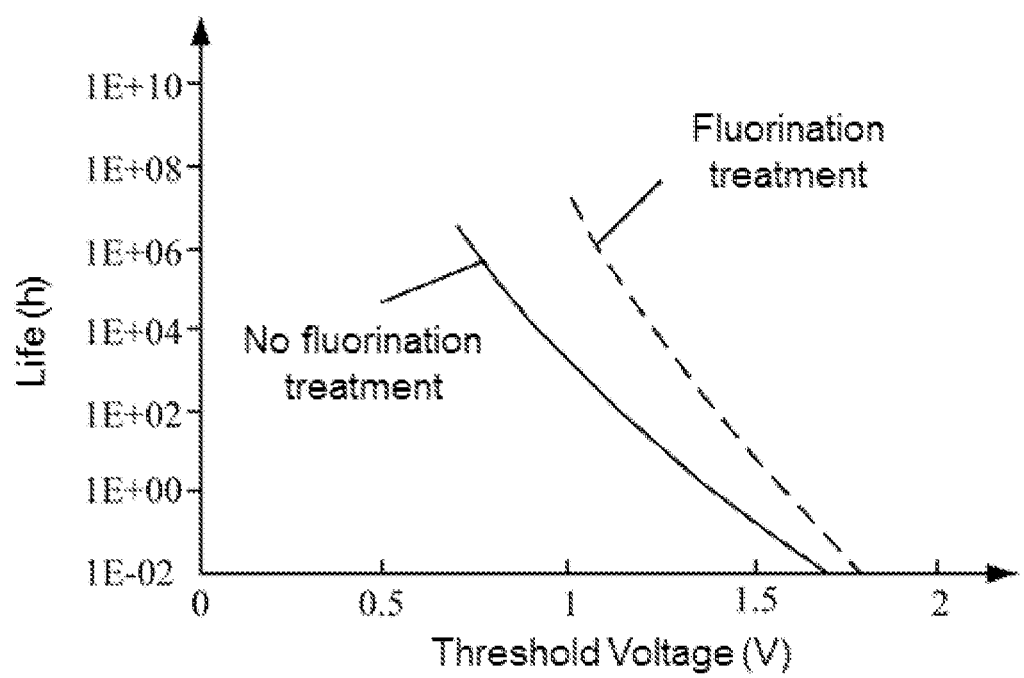
FIG. 17 compares lifetime of an exemplary NMOS transistor formed with and without a fluorination treatment in accordance with various disclosed embodiments.

FIG. 17 compares lifetime of an exemplary NMOS transistor formed with and without a fluorination treatment. As shown, the dotted line depicts the lifetime of an exemplary fluorinated NMOS transistor as a function of threshold voltage, and the solid line depicts the lifetime of an exemplary untreated NMOS transistor (e.g., without fluorination) as a function of threshold voltage. FIG. 17 shows that fluorinated NMOS transistor has much longer lifetime than the untreated NMOS transistor.

Figure 18:
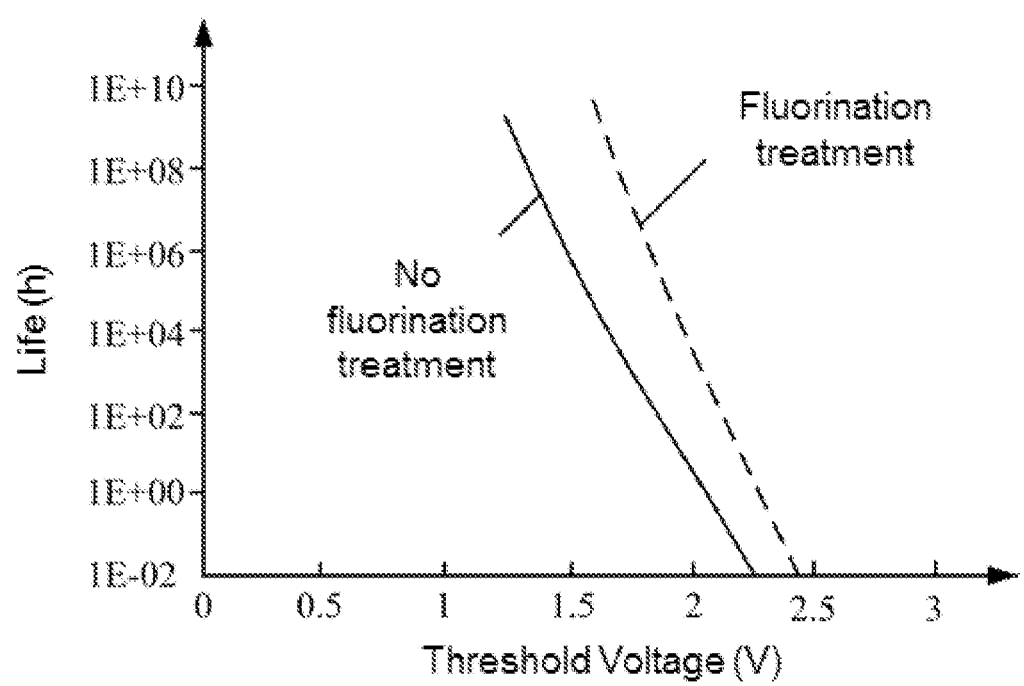
FIG. 18 compares lifetime of an exemplary PMOS transistor formed with and without a fluorination treatment in accordance with various disclosed embodiments.

FIG. 18 compares lifetime of an exemplary PMOS transistor formed with and without a fluorination treatment. As shown, the dotted line depicts the lifetime of an exemplary fluorinated PMOS transistor as a function of threshold voltage, and the solid line depicts the lifetime of an exemplary untreated PMOS transistor (e.g., without fluorination) as a function of threshold voltage. FIG. 18 shows that fluorinated PMOS transistor has much longer lifetime than the untreated PMOS transistor.

Figure 20:
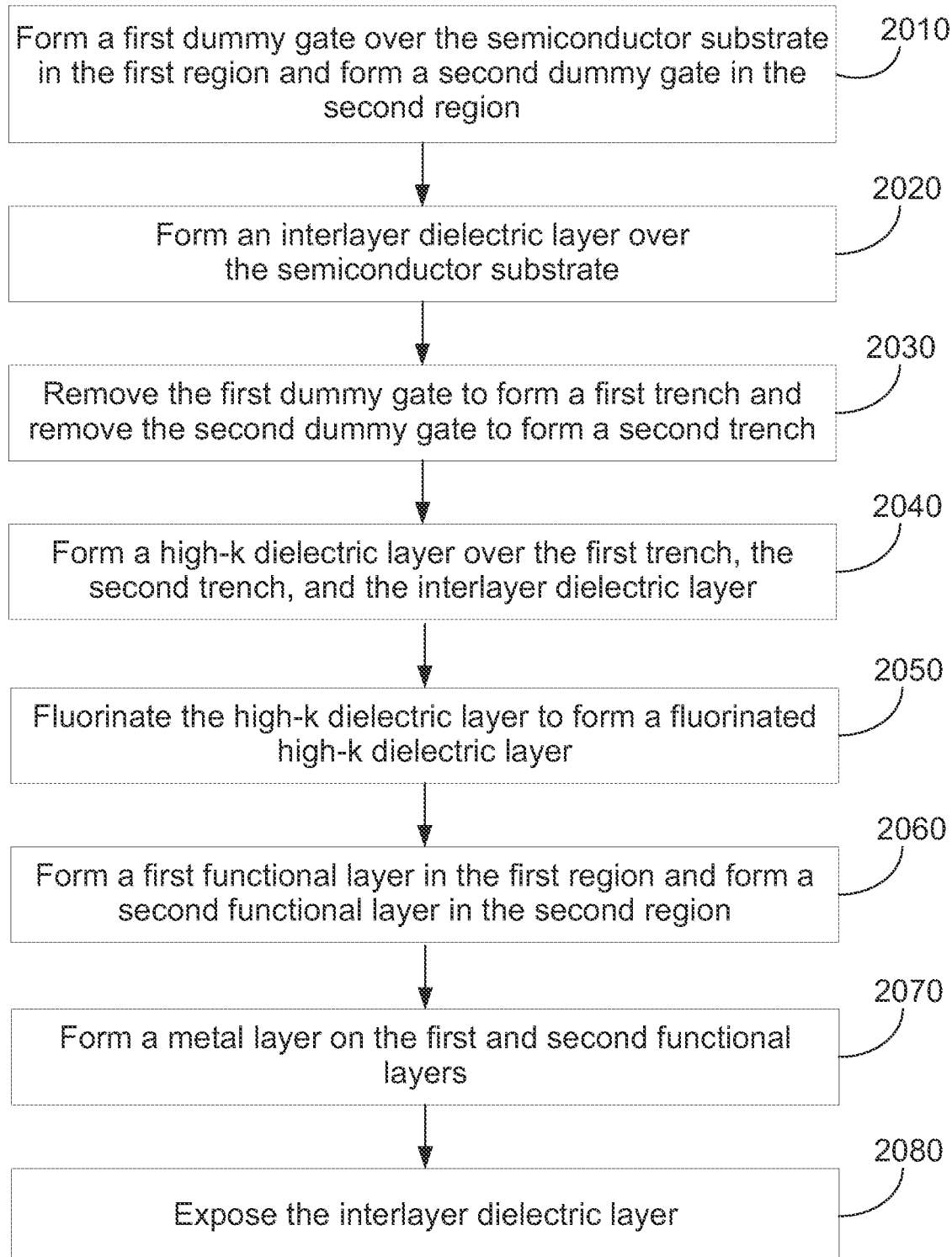
FIG. 20 depicts an exemplary method for forming an exemplary CMOS transistor in accordance with various disclosed embodiments.

FIGS. 9-16 are schematics of cross-sectional views of an exemplary CMOS transistor, while FIG. 20 depicts an exemplary method for forming an exemplary CMOS transistor in accordance with various disclosed embodiments. Note that although FIGS. 9-16 depict structures corresponding to the method depicted in FIG. 20, the structures and the method are not limited to each other in any manner.

Figure 9:
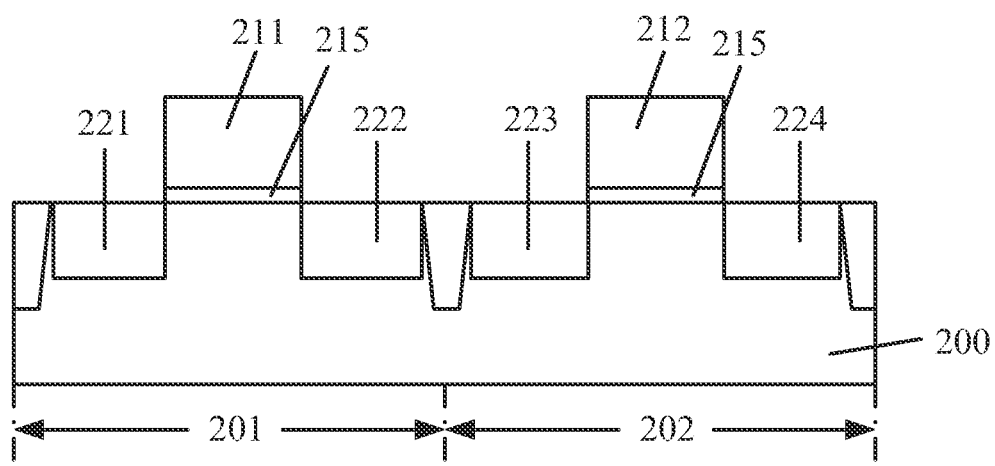
FIGS. 9-16 are schematics of cross-sectional views of an exemplary CMOS device at various stages during its formation in accordance with various disclosed embodiments.

In Step 2010 of FIG. 20 and referring to FIG. 9, there is provided a semiconductor substrate 200 having a first region 201 and a second region 202. A second silicon oxide layer 215 can be formed on the semiconductor substrate 200. A first dummy gate 211 can be formed on the second silicon oxide layer 215 in the first region 201. A second dummy gate 212 can be formed on the second silicon oxide layer 215 in the second region 202. A first source region 221 and first drain region 222 can be formed in the semiconductor substrate 200 on both sides of the first dummy gate 211. A second source region 223 and second drain region 224 can be formed in the semiconductor substrate 200 on both sides of the second dummy gate 212.

An NMOS transistor can be formed in the first region 201, and a PMOS transistor can be formed in the second region 202, or vice versa. In one embodiment, the first source region 221 and the first drain region 222 can be N-type doped regions, and the second source region 223 and the second drain region 224 can be P-type doped regions.

Figure 10:
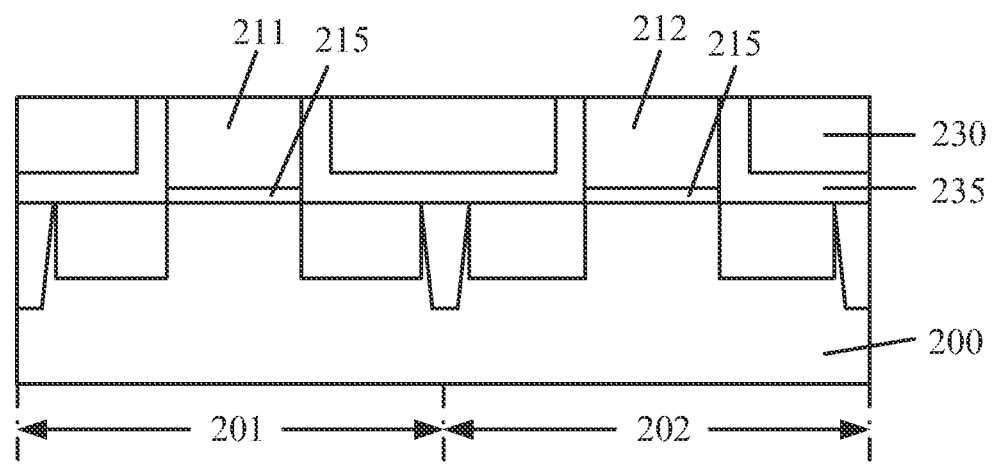

In Step 2020 of FIG. 20 and referring to FIG. 10, an etch stop layer 235 can be formed on the semiconductor substrate 200 and on the first dummy gate 211 and the second dummy gate 212. An interlayer dielectric layer 230 can be formed on the etch stop layer 235. A polishing or planarization process, e.g., a CMP, can be performed to expose top surfaces of each of the first dummy gate 211 and the second dummy gate 212 from the interlayer dielectric layer 230. Further, the surface of the interlayer dielectric layer 230 can be flush with the surfaces of the first dummy gate 211 and the second dummy gate 212.

Figure 11:
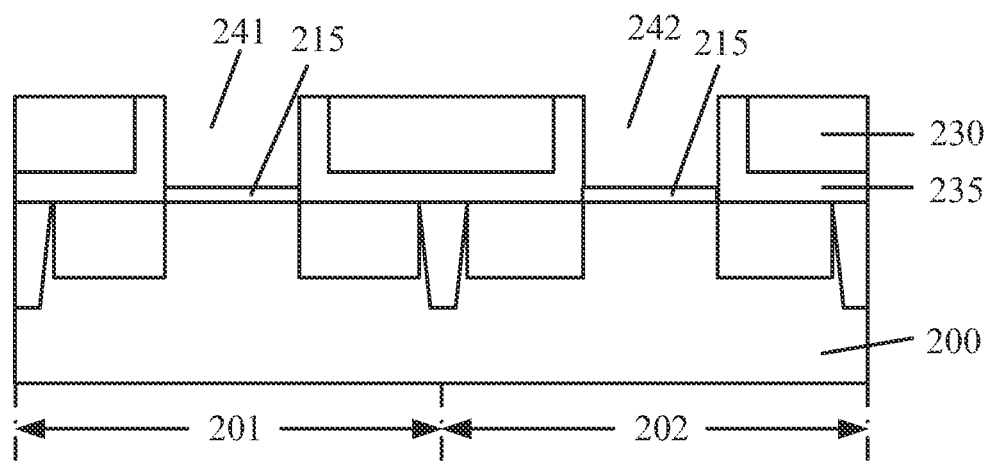

In Step 2030 of FIG. 20 and referring to FIG. 11, the first dummy gate 211 can be removed to form a first trench 241 in the first region 201. The second dummy gate 212 can be removed to form a second trench 242 in the second region 202.

Figure 12:
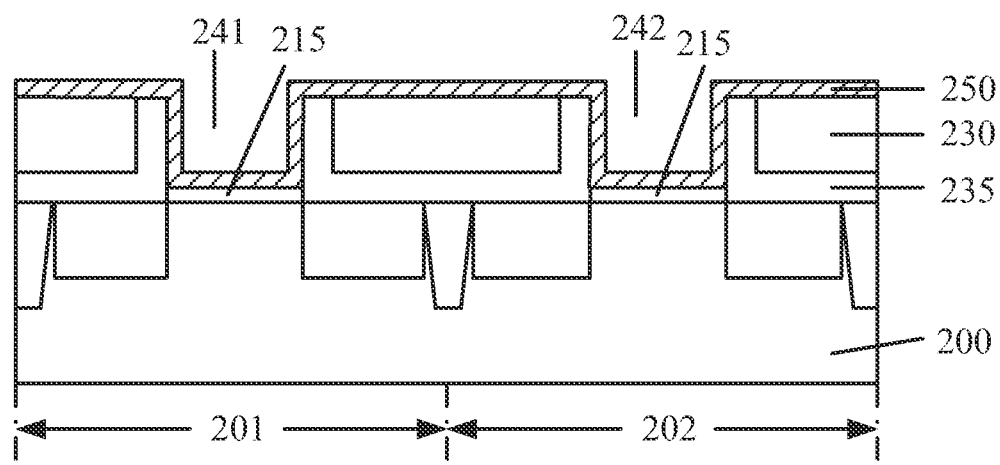

In Step 2040 of FIG. 20 and referring to FIG. 12, a high-k gate dielectric layer 250 can be conformally formed on the entire surface of the structure shown in FIG. 11, including each surface of the bottoms and sidewalls of the first trench 241 and the second trench 242 and the interlayer dielectric layer 230.

Figure 13:
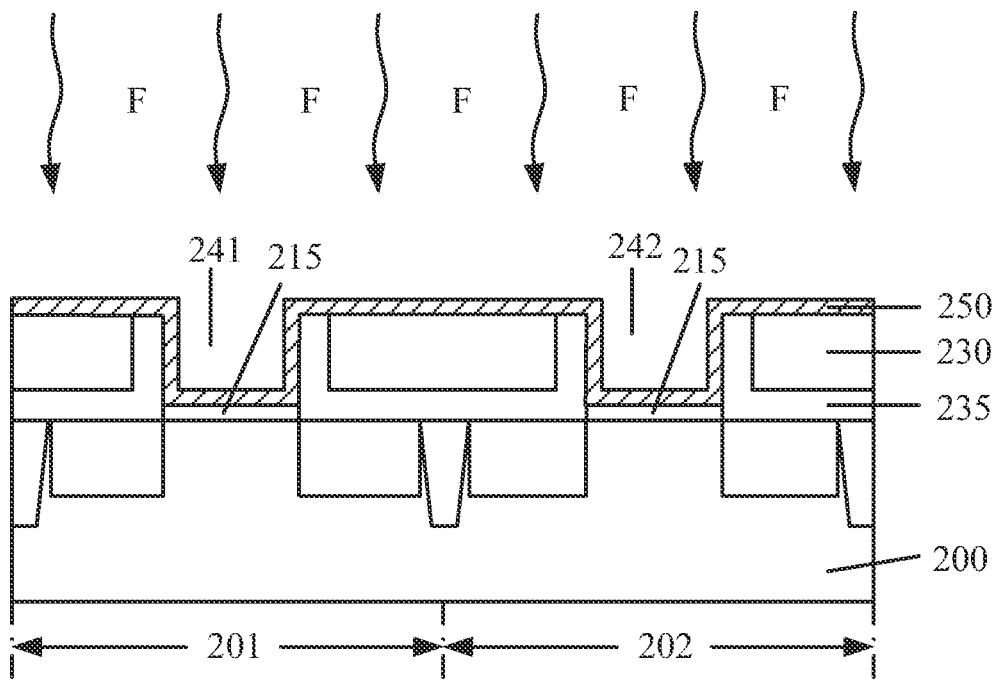

In Step 2050 of FIG. 20 and referring to FIG. 13, the high-k gate dielectric layer 250 and/or related layers/components can be treated by a fluorination process. The fluorination process can include those disclosed above as shown in FIG. 5 and/or in Step 1950 in FIG. 19.

Figure 14:
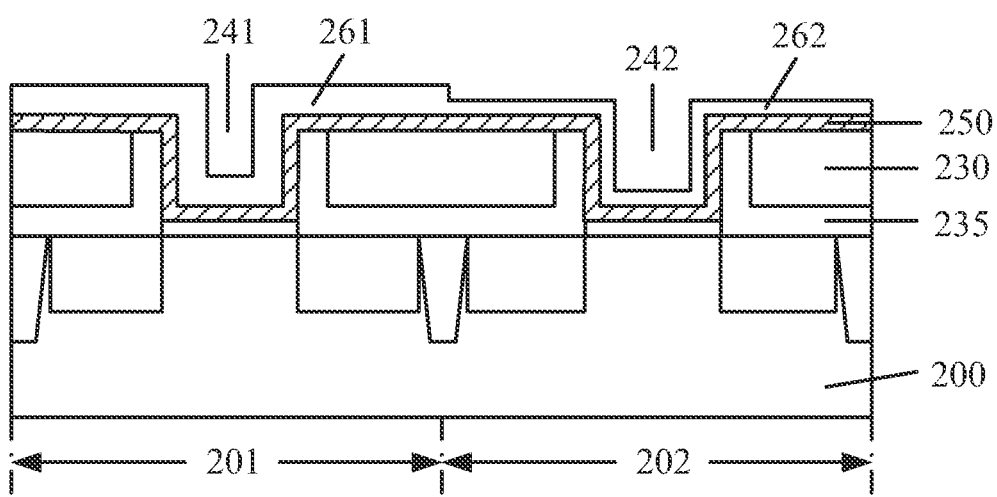

In Step 2060 of FIG. 20 and referring to FIG. 14, a functional layer can be formed on the fluorinated high-k gate dielectric layer 250. The functional layer can be partially etched, either in the first region 201 or in the second region 202 such that a first functional layer 261 formed in the first region 201 and a second functional layer 262 formed in the second region 202 can have different thickness. The difference in thickness may result in difference in work function for the two functional layers 261/262.

In a CMOS transistor, an NMOS transistor and a PMOS transistor may require their functional layers for different work functions by having different thicknesses and/or using different materials. For example, to form the structure shown in FIG. 14, a uniform functional layer can be formed first, and then a mask layer can be formed on the functional layer in the first region 201. The functional layer in the second region 202 can be partially etched using the mask layer such that the first functional layer 261 in the first region 201 and the second functional layer 262 in the second region 202 can have different thicknesses and thus different work functions. In this case, the processing time can be saved.

In other embodiments, the first and the second functional layers 261/262 can be formed on the fluorinated high-k gate dielectric layer in corresponding first and second regions by separate processes or steps.

Figure 15:
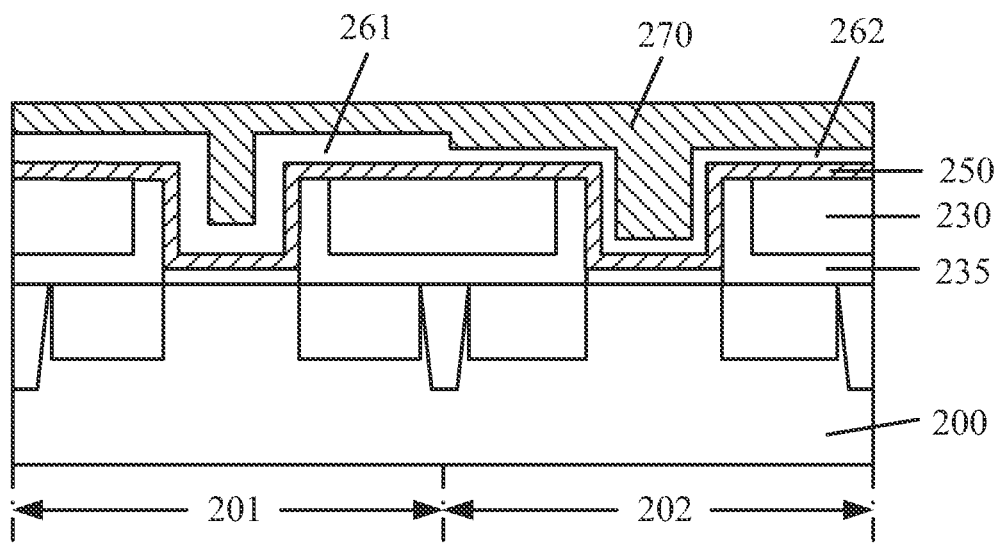

In Step 2070 of FIG. 20 and referring to FIG. 15, a metal layer 270 can be formed on the first functional layer 261 and the second functional layer 262. The metal layer 270 can fill the first trench 241 in the first functional layer 261 in the first region 201 and can fill the second trench 242 in the second functional layer 262 in the second region 202.

Figure 16:
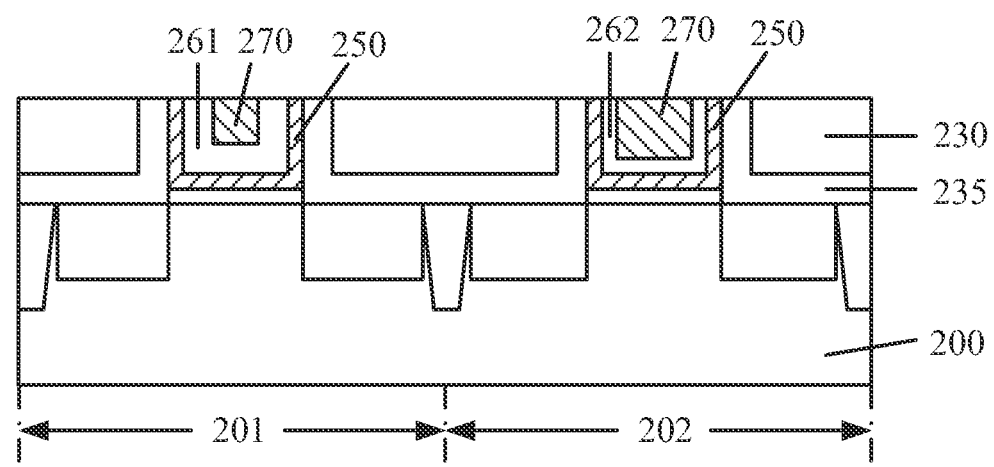

In Step 2080 of FIG. 20 and referring to FIG. 16, the layers on the interlayer dielectric layer 230, including the metal layer 270, the first functional layer 261, the second functional layer 262, and the fluorinated high-k gate dielectric layer 250, can be polished to expose a surface of the interlayer dielectric layer 230. The metal layer 270 in the first trench, the first functional layer 261, and the fluorinated high-k dielectric layer 250 can form a first metal gate structure. The metal layer 270 in the second trench, the second functional layer 262, and the fluorinated high-k dielectric layer 250 can form a second metal gate structure.

In this manner, a metal gate structure can be formed by a process including, e.g., removing a dummy gate to form a trench; conformally forming a high-k gate dielectric layer on surfaces of the bottom and sidewall of the trench; and treating the high-k gate dielectric layer by a fluorination process such that fluorine bonds (e.g., F—Si, F—Hf, etc.) are formed between the high-k gate dielectric layer and the semiconductor substrate.

Since the fluorine bond can have higher bond energy than hydrogen bonds, the negative bias temperature instability of the formed transistor can be reduced. In addition, because fluorine is a strong oxidant, it can prevent oxygen vacancies from producing donor levels in the band gaps and from becoming positively charged. As a result, the oxygen vacancies can be passivated and the positive bias temperature instability of the formed devices can be reduced.

The embodiments disclosed herein are exemplary only. Other applications, advantages, alternations, modifications, or equivalents to the disclosed embodiments are obvious to those skilled in the art and are intended to be included within the scope of the present disclosure.

What is claimed is:

1. A method for forming a transistor comprising:
providing a semiconductor substrate;
forming a dummy gate and an interlayer dielectric layer having a flushed top surface over the semiconductor substrate;
removing the dummy gate to form a trench over the semiconductor substrate;
forming a high-k dielectric layer over each surface of the trench and the interlayer dielectric layer;
fluorinating the high-k dielectric layer to form a fluorinated high-k dielectric layer by a fluorination process, wherein a channel region in the semiconductor substrate under the dummy gate is simultaneously fluorinated in the fluorination process;
forming a functional layer on the fluorinated high-k dielectric layer;
forming a metal layer on the functional layer to fill the trench with the metal layer; and
exposing the interlayer dielectric layer by polishing the metal layer, the functional layer, and the fluorinated high-k dielectric layer on the interlayer dielectric layer.

2. The method of claim 1, wherein the fluorinating includes one or more processes selected from an ion implantation with fluorine-containing ions, an annealing at a fluorine-containing atmosphere, and an annealing at a fluorine-containing plasma environment.

3. The method of claim 2, wherein the ion implantation with fluorine-containing ions includes:
plasma ionizing a fluorine-containing gas to form a fluorine-containing plasma; and
implanting the fluorine-containing plasma into the high-k dielectric layer using an implantation energy ranging from about 2 KeV to about 20 KeV and an implantation dosage ranging from about $1 \times 10^{17}$ atoms/m$^3$ to about $1 \times 10^{20}$ atoms/m$^3$.

4. The method of claim 2, wherein the annealing at the fluorine-containing atmosphere includes controlling a reaction chamber to have a pressure ranging from about 0.5 Torr to about 5 Torr, a temperature ranging from about 300° C. to about 800° C., and an annealing time ranging from 5 seconds to about 60 seconds.

5. The method of claim 2, wherein the annealing at the fluorine-containing plasma environment includes:
forming a fluorine-containing plasma in a reaction chamber; and
controlling the reaction chamber to have a pressure ranging from about 0.5 Torr to about 5 Torr, a temperature ranging from about 300° C. to about 800° C., and an annealing time ranging about from about 5 seconds to about 60 seconds.

6. The method of claim 1, wherein the fluorinating uses a fluorine source selected from $F_2$, HF, $NF_3$, $PF_5$, $PF_3$, $CF_4$, $CH_2F_2$, $CHF_3$, or combinations thereof.

7. The method of claim 1, wherein the high-k dielectric layer is made of a material including $HfO_2$, $La_2O_3$, HfSiON, $HfAlO_2$, or combinations thereof.

8. The method of claim 1, wherein the functional layer is made of a material including Ti, Ta, TiN, TaN, TiAl, TaC, TaSiN, TiAlN, or combinations thereof.

9. The method of claim 1, further including:
conformally forming a first silicon oxide layer over each surface of the trench and the interlayer dielectric layer, and
forming the high-k dielectric layer over the first silicon oxide layer, wherein the first silicon oxide layer is fluorinated in the fluorination process.

10. The method of claim 1, wherein a second silicon oxide layer is formed between the semiconductor substrate and the dummy gate.

11. The method of claim 1, further including forming a source region and a drain region in the semiconductor substrate on both sides of the dummy gate.

12. The method of claim 1, further including:
forming a silicon oxide layer between the dummy gate and the semiconductor layer, wherein the silicon oxide layer is fluorinated in the fluorination process.

13. The method of claim 1, further including:
forming an etch stop layer between the interlayer dielectric layer and the semiconductor substrate and between the interlayer dielectric layer and the dummy gate, wherein the etch stop layer is capable of exerting a tensile or compressive stress on the semiconductor substrate.

14. A method for forming a CMOS transistor comprising:
providing a semiconductor substrate including a first region and a second region;
forming a first dummy gate in the first region and forming a second dummy gate in the second region;
forming an interlayer dielectric layer over the semiconductor substrate, wherein the interlayer dielectric layer has a top surface flushed with a top surface of each of the first and the second dummy gates;
removing the first dummy gate to form a first trench, and removing the second dummy gate to form a second trench;
conformally forming a high-k dielectric layer over each surface of the first trench, the second trench, and the interlayer dielectric layer;
simultaneously fluorinating the high-k dielectric layer in the first region and in the second region to form a fluorinated high-k dielectric layer by a fluorination process;
forming a first functional layer on the fluorinated high-k dielectric layer in the first region and forming a second functional layer on the fluorinated high-k dielectric layer in the second region, wherein the first functional layer and the second functional layer have different work functions;
forming a metal layer on the first and second functional layers to fill each of the first trench and the second trench; and
exposing the interlayer dielectric layer by a surface planarization process.

15. The method of claim 14, wherein forming the first functional layer and the second functional layer includes:
forming a functional layer on the fluorinated high-k dielectric layer in the first and second regions, and
partially etching the functional layer in one of the first and the second regions to form the first functional layer in the first region and the second functional layer in the second region, wherein the first and second functional layers have different thickness.

16. The method of claim 14, further including:
forming a source region and a drain region in the semiconductor substrate on both sides of the first dummy gate, and
forming a source region and a drain region in the semiconductor substrate on both sides of the second dummy gate.

17. The method of claim 14, wherein the surface planarization process includes polishing the metal layer, the first and second functional layers, and the fluorinated high-k dielectric layer on the interlayer dielectric layer.

18. The method of claim 14, wherein a channel region in the semiconductor substrate under each of the first dummy gate and the second dummy gate is simultaneously fluorinated in the fluorination process.

19. The method of claim 14, further including:
forming a silicon oxide layer under the first dummy gate and the second dummy gate, on the semiconductor layer, wherein the silicon oxide layer is fluorinated in the fluorination process.

20. The method of claim 14, further including:
forming an etch stop layer between the interlayer dielectric layer and the semiconductor substrate in the first and second regions, and between the interlayer dielectric layer and the first dummy gate, and between the interlayer dielectric layer and the second dummy gate, wherein the etch stop layer is capable of exerting a tensile or compressive stress on the semiconductor substrate.

* * * * *